(12) United States Patent
Ulasyuk (10) Patent No.: US 9,136,444 B2
(45) Date of Patent: Sep. 15, 2015

(54) LED WHITE LIGHT SOURCE WITH REMOTE PHOTOLUMINESCENT REFLECTING CONVERTER

(76) Inventor: Vladimir Nikolaevich Ulasyuk, Fryazino (RU)

( * ) Notice: Subject to any disclaimer, the term of this patent is extended or adjusted under 35 U.S.C. 154(b) by 93 days.

(21) Appl. No.: 13/976,101

(22) PCT Filed: Dec. 20, 2011

(86) PCT No.: PCT/RU2011/001006
§ 371 (c)(1),
(2), (4) Date: Jul. 31, 2013

(87) PCT Pub. No.: WO2013/039418
PCT Pub. Date: Mar. 21, 2013

(65) Prior Publication Data
US 2013/0306998 A1    Nov. 21, 2013

(30) Foreign Application Priority Data

Jan. 13, 2011 (RU) ................................ 2011100487

(51) Int. Cl.
*H01L 33/00* (2010.01)
*H01L 33/50* (2010.01)
*F21K 99/00* (2010.01)
*C09K 11/77* (2006.01)
*F21V 7/04* (2006.01)
*F21V 7/22* (2006.01)
*F21V 7/00* (2006.01)

(52) U.S. Cl.
CPC .......... *H01L 33/507* (2013.01); *C09K 11/7774* (2013.01); *F21K 9/56* (2013.01); *F21V 7/005* (2013.01); *F21V 7/043* (2013.01); *F21V 7/22* (2013.01); *F21K 9/137* (2013.01); *F21V 7/0008* (2013.01); *H01L 2224/48091* (2013.01); *H01L 2224/48247* (2013.01); *H01L 2224/48465* (2013.01); *Y02B 20/181* (2013.01)

(58) Field of Classification Search
None
See application file for complete search history.

(56) References Cited

U.S. PATENT DOCUMENTS

| 2007/0086211 | A1  | 4/2007 | Beeson |
| 2008/0144328 | A1* | 6/2008 | Yagi et al. ...................... 362/516 |
| 2009/0200566 | A1* | 8/2009 | Bukesov ........................ 257/98 |
| 2010/0067216 | A1* | 3/2010 | Li .................................. 362/84 |
| 2011/0133222 | A1* | 6/2011 | Allen et al. ..................... 257/88 |
| 2011/0175518 | A1* | 7/2011 | Reed et al. ..................... 313/483 |

* cited by examiner

FOREIGN PATENT DOCUMENTS

| AU | 2002368183 A1 | 3/2004 |
| EP | 1381091 A2 | 7/2003 |
| WO | WO2004019422 | 3/2004 |

*Primary Examiner* — David Vu
*Assistant Examiner* — Cuong Nguyen
(74) *Attorney, Agent, or Firm* — DeFillo & Associates, Inc.; Evelyn A. DeFillo (57) ABSTRACT

The proposed illuminator relates to white-light lamps based on LEDs with remote photoluminescent converters. The illuminator comprises a heat removing base with a radiation output orifice, and the LEDs secured near the periphery of the orifice, with, arranged in series at a distance from the a concave photoluminescent converter layer and a concave light reflector, wherein the converter layer's and light reflector's concavities are oriented towards the LED's and the opening. White light mix of the LEDs' and converter layer's radiation exits via the orifice. The converter layer and reflector may have the form of a truncated ellipsoid of revolution, in particular a sphere, or a paraboloid, with a main axis perpendicular to the plane of the orifice, or a cylinder truncated by the plane of the orifice. The outside reflector' surface may have ribbed heat radiators associated with the heat removing base.

10 Claims, 11 Drawing Sheets

LED WHITE LIGHT SOURCE WITH REMOTE PHOTOLUMINESCENT REFLECTING CONVERTER

CROSS-REFERENCE TO RELATED APPLICATIONS

This application is a U.S. national phase application of a PCT application PCT/RU2011/001006 filed on 20 Dec. 2011, published as WO2013/039418, whose disclosure is incorporated herein in its entirety by reference, which PCT application claims priority of a Russian patent application RU 2011100487 filed on 13 Jan. 2011.

FIELD OF THE INVENTION

The present invention relates to electrical and electronic equipment, and more particularly to light sources based on semiconductor light-emitting diodes (LEDs), more particularly to a white light source based on LEDs with conversion photoluminescent phosphors.

BACKGROUND OF THE INVENTION

Solid-state lighting technology is starting to conquer the white lighting market, thanks to recent advances in the development of efficient LEDs, especially nitride (InGaN), and the highest achievable lighting efficiency of all white light sources known in the art. LED solutions are widely used in the lighting apparatus, such as linear and street illuminators wherein the illuminator is relatively large, and intensely heated LEDs can be distributed so as to facilitate the efficient removal of heat from them.

The development of LED replacements for standard incandescent and halogen lamps having a small form factor and a high luminous flux, in view of significant prospects for solving the energy saving problem, is one of the most critical scientific and technical tasks; however, its solution is significantly hindered by the limited space for installing the control electronics (drivers) and a relatively small surface area for removal of heat emitted by LEDs in such lamps.

White LEDs often include a blue LED coated with YAG:Ce phosphor. High-power (one watt or more) blue LEDs have an efficiency of about 30-45%, with approximately 550-700 mW allocated to unit heating from each applied watt. Furthermore, it is believed that when phosphor converts the blue light into the yellow one in white LEDs, approximately 20% of the incident light energy is spent for phosphor heating. Technical specifications indicate that blue LED radiation power loss is about 7% at the temperature of 25-125° C., while power loss of white LEDs is about 20% at the same temperature. Thus, high-power white LEDs have substantial limitations on heat and luminous fluxes.

AIM AND BRIEF DESCRIPTION OF THE PRESENT INVENTION

The objective of the present invention is to provide a LED lamp with a small form factor, wherein the problems of the known technical solutions have been overcome, to replace standard lamps.

According to the present invention, there is proposed an illuminator, generally comprising:—a radiation converter designed as a conversion material layer having a converter surface with a predetermined converter's concavity remote from said primary radiation source, said radiation converter converts primary radiation, emitted by the at least one light emitting diode and incident on the converter surface, into secondary radiation;—a reflector having a reflector surface with a predetermined reflector's concavity; said reflector surface reflects radiation incident thereon; wherein: said at least one light-emitting diode is located in predetermined proximity to said perimeter; the converter surface is positioned between the primary radiation source and the reflector surface at a predetermined distance from said reflector surface; and the converter's concavity and the reflector's concavity face said orifice and said at least one light-emitting diode. Specific detail embodiments of the invention are discussed herein below.

DETAIL DESCRIPTION OF PREFERRED EMBODIMENTS OF THE INVENTION

The structure of any LED lamp designed to replace standard white light lamps is based on LED chips. White light results from mixing of radiation emitted from LED chips and different light colors such as blue, green and red, or blue and orange, etc.

Figure 1:
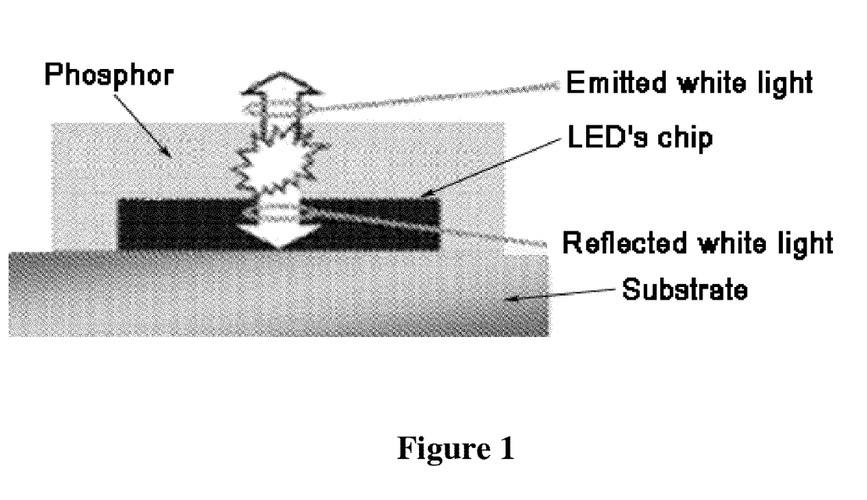
FIG. 1 shows a diagram explaining an operating principle of a white light source generally known in prior art.

However, in recent years LED white light sources with photoluminescent phosphor converters, which radiate yellow or orange (red) light while absorbing blue or UV radiation of LED chip, are becoming the most widespread light sources. FIG. 1 shows a diagram explaining the operating principle of a white light source of this type.

The apparatus comprises a LED chip that emits primary relatively shortwave radiation and a conversion photoluminescent phosphor medium which is irradiated with the said relatively shortwave radiation and which, upon irradiation by the specified relatively shortwave radiation, is excited and emits in response a second radiation with relatively longer waves. In the particular embodiment, the monochrome blue or UV radiation emitting from the chip is converted to white light by placing the chip in organic and/or inorganic phosphors (photoluminescent phosphors) in a polymer matrix.

Figure 2:
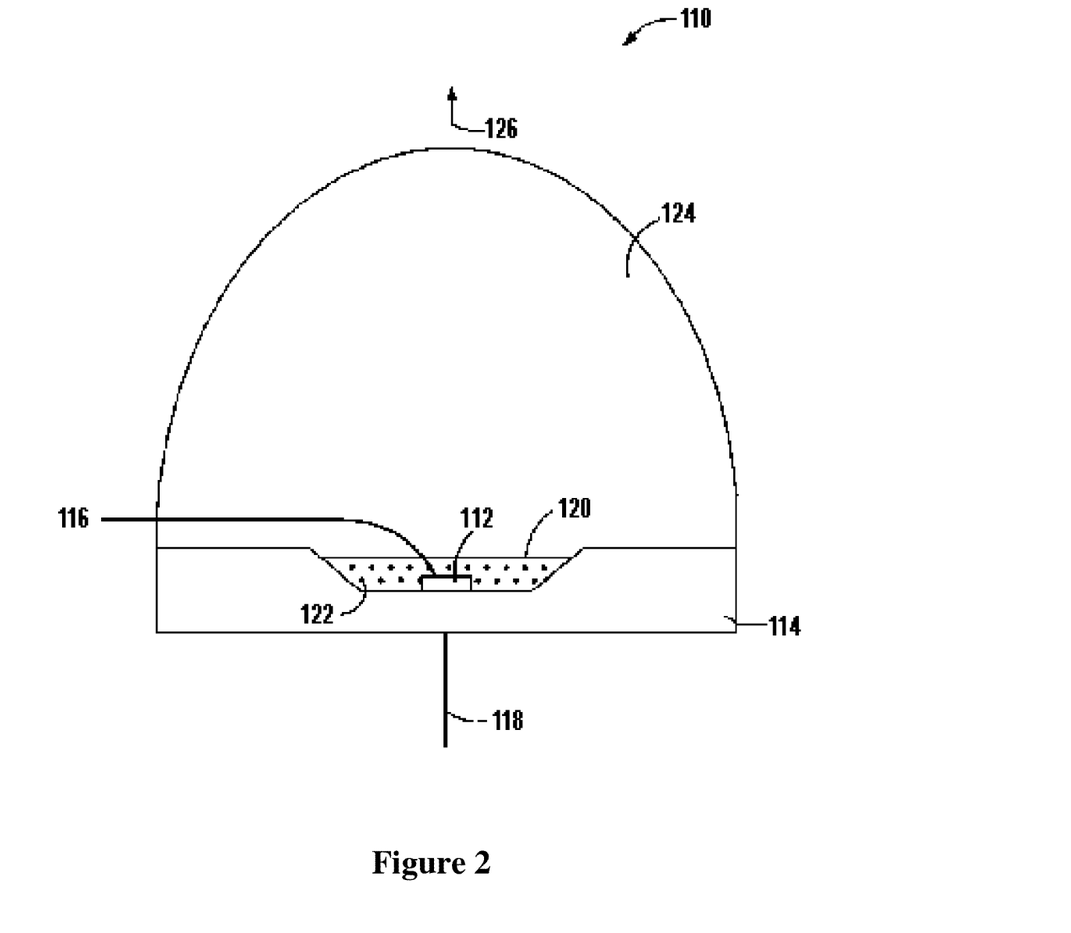
FIG. 2 shows LED white light source with photoluminescent phosphor conversion, as described in prior art.

FIG. 2 shows a known LED white light source with photoluminescent phosphor conversion, as described in U.S. Pat. No. 6,351,069.

White light source 110 includes a nitride LED chip 112, which, when excited, emits primary blue radiation. The chip 112 is placed on the conductive frame of the reflector cup 114 and is electrically connected to conductors 116 and 118. Conductors 116 and 118 supply the chip 112 with electric power. The chip 112 is covered with the transparent resin layer 120 that includes conversion material for converting the wavelength of radiation 122.

Conversion material type used to form layer 120 can be selected depending on the desired spectral distribution of the secondary radiation produced by material 122. The chip 112 and the fluorescent layer 120 are covered by a lens 124. The lens 124 is typically made of a transparent epoxy or silicone. When using a white light source the voltage is applied to the chip 112, wherein the primary radiation is emitted by the upper surface of the chip. The emitted primary radiation is partially absorbed by the conversion material 122 in the layer 120.

Thereafter the conversion material 122, in response to the absorption of the primary light, emits secondary radiation, i.e. converted light having a peak with a longer wavelength. The remaining unabsorbed portion of the emitted primary radiation is transmitted through the conversion layer together with the secondary radiation. The lens 124 directs the unabsorbed primary radiation and the secondary radiation in a general direction indicated by the arrow 126 as outgoing light.

Thus, the outgoing light is a complex light which is composed of the primary radiation emitted by the chip 112 and the secondary radiation emitted by the conversion layer 120. The conversion material can also be configured so only a small portion or even all primary light remains in the device as in the case of a chip that emits primary UV light combined with one or more conversion materials emitting visible secondary light.

The aforementioned apparatus known in the art, wherein a photoluminescent phosphor layer is formed on LED surface, has several disadvantages. It is difficult to achieve color uniformity when photoluminescent phosphor is in direct mechanical, optical and thermal contact with the LED surface due to significant changes in the light path length depending on the angle of radiation propagation through the photoluminescent phosphor layer. Furthermore, high temperature of the heated LED can undesirably alter the color coordinates of the photoluminescent phosphor or can lead to its degradation.

Figure 3:
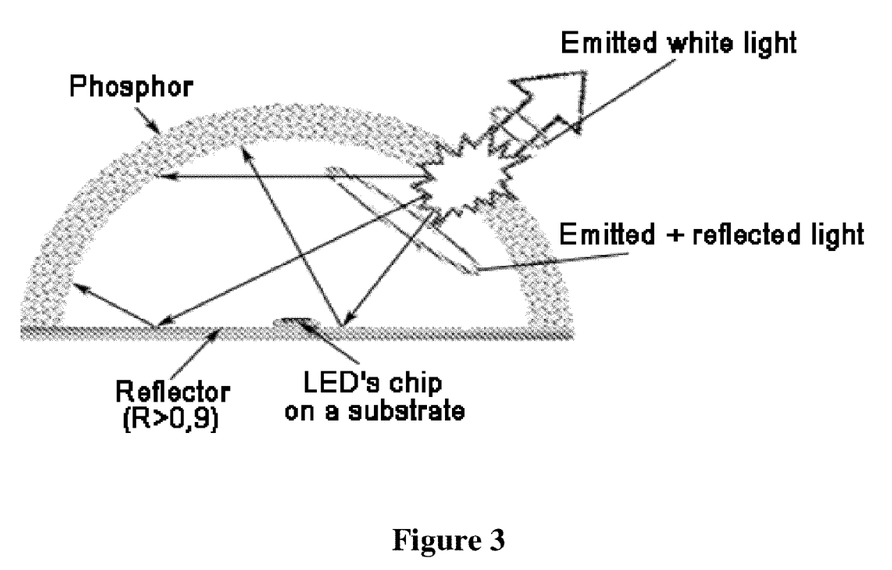
FIG. 3 shows a diagram explaining an operating principle of LED white light source with a remote phosphor wavelength converter.

In order to eliminate the specified disadvantages white light sources with a wavelength converter remote from LED were proposed, which operating principle is explained in FIG. 3.

Figure 4:
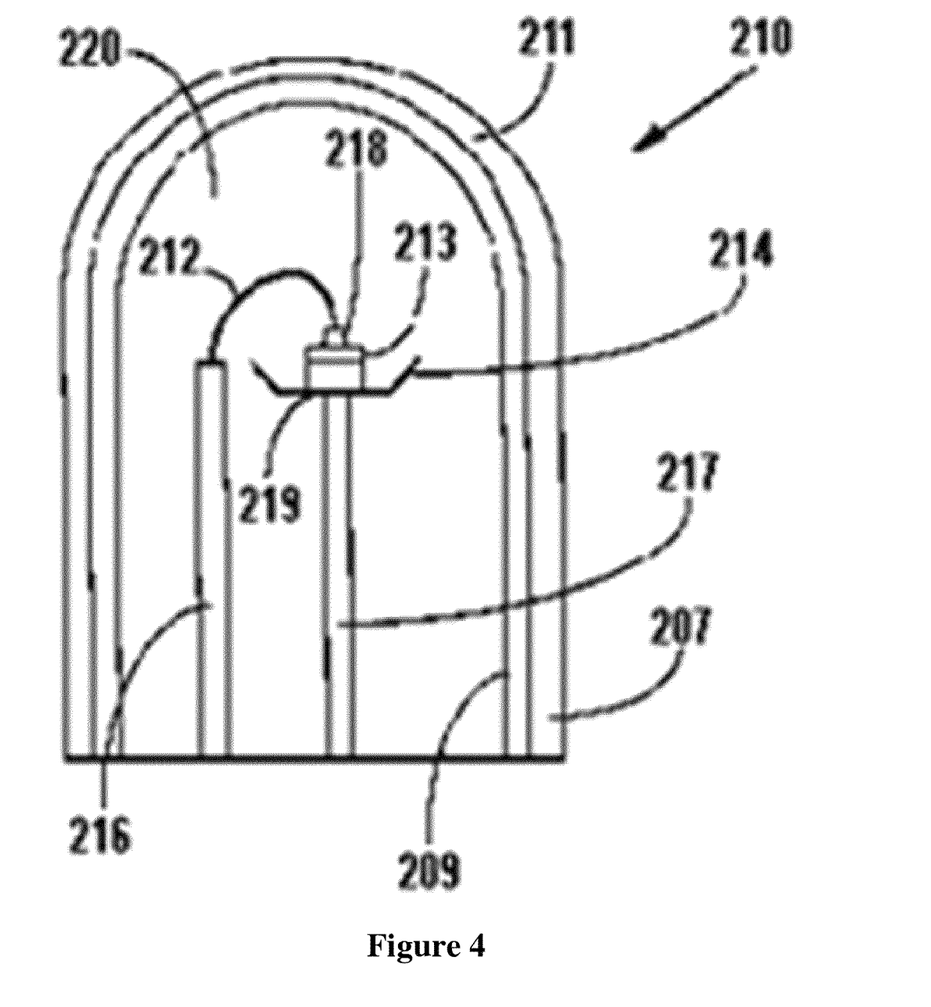
FIG. 4 shows LED white light source with a remote phosphor wavelength converter, as described in prior art.

The arrangement of the illuminator built according to this principle and described, for instance, in U.S. Pat. No. 6,600,175 (B1) is shown in FIG. 4.

This white light source comprises a shell 207 formed by a transparent medium 211, with an internal volume. The medium 211 can be formed by any suitable material that transmits light, such as transparent polymer or glass. The internal volume of the medium 211 comprises a light emitting diode (LED) 213 chip placed on the base 214.

First and second electrical contacts 216 and 217 are connected to radiating and back sides 218 and 219 of the LED 213 chip, respectively, and to a radiating side 218 of the LED, which is next to the first electrical contact 216 by the conductor 212. The light transmitting medium 211 is associated with fluorescent and/or phosphorescent components, or mixtures thereof, in other words, photoluminescent phosphor medium which converts the radiation emitted by the side 218 of the LED 213 into white light.

Photoluminescent phosphor is scattered in the shell 207 of the medium 211 and/or is arranged in the form of a film coating 209 on the inner wall of the shell 207 surface. Alternatively, photoluminescent phosphor can be a coating on the outer wall of the assembly (not shown) shell if the shell is used exclusively in the environment, wherein such an outer coating can be satisfactorily maintained (e.g., where it is not subject to abrasion or degradation).

For example, photoluminescent phosphor can be distributed in polymer, or glass melt, from which the shell is formed to provide a homogeneous composition of the shell and ensure light output from the entire surface of the shell.

Figure 5:
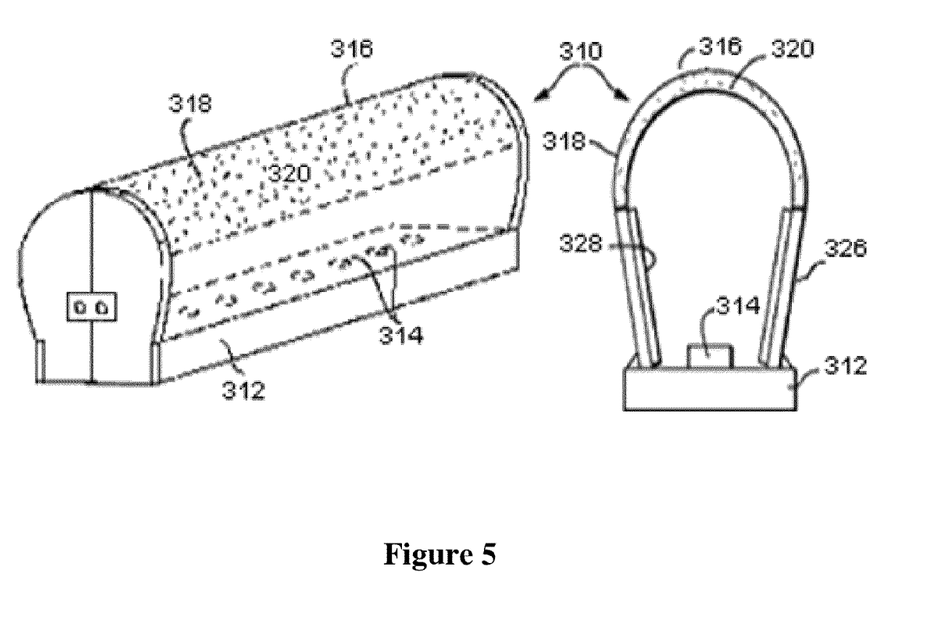
FIG. 5 shows white LED elongated illuminator with a cylindrical remote phosphor wavelength converter, as described in prior art.

Elongated white LED illuminator with remote cylindrical converter is known in the art, as described in U.S. Pat. No. 7,618,157 B1. Its arrangement is schematically shown in FIG. 5. The illuminator 310 comprises a linear heat sink 312, a plurality of the LEDs 314 mounted on the heat sink 312 along the long side of the heat sink, and the light emitting dome 316 mounted on the heat sink 312 on one line with the LEDs 314, wherein a portion 318, half-round in section, of the dome 316 located against the LEDs 314 comprises a photoluminescent phosphor 320 which is excited by the light from the LEDs. The heat sink 312 is made of heat-conductive material, such as aluminum. The dome 316 is made of transparent material, such as glass or plastic.

The photoluminescent phosphor 320 can be applied as a coating on the inner side of the dome or introduced into the coating material. The flat portions 326 without photoluminescent phosphor which are attached to the heat sink on both sides of the LEDs have internal reflective surfaces 328, for example, aluminum coatings reflecting light which comes from the LEDs 314 to the dome portion 318.

The conversion layer can comprise photoluminescent phosphor material, quantum dot material, or a combination of such materials, and can further comprise a transparent host material, wherein phosphor material and/or quantum dot material are dispersed.

It is known that the layers that contain powdered photoluminescent phosphor materials can conduct, absorb, reflect and dissipate the light incident on them. When this layer dissipates the light, it can also conduct, absorb and reflect some of the scattered light.

Due to this fact a common disadvantage of said known inventions is that the radiation excited in photoluminescent phosphor grains under the influence of LED radiation as well as reflected LED radiation are inevitably partially absorbed in the photoluminescent phosphor layer and on inner elements of the apparatus, which reduces efficiency of the white light source.

Yamada [1] and Narendran [2] determined the ratio of portions of the radiation propagating back and forth from the conversion layer of the photoluminescent phosphor YAG:Ce excited by blue light radiation with a wavelength of about 470 nm, which is converted into yellow wavelength range radiation. Narendran proved that in this case more than 60% of the light emitted and reflected by the conversion layer extends back to the excitation source, and a large portion of this light is lost within the LED assembly [2]. In [3] it is proved that even in the case of YAG:Ce photoluminescent phosphor with optical refractive index 1.8, which is mixed in epoxy resin with optical refractive index 1.6 at the photoluminescent phosphor density of 8 mg/cm2, which allows creating a balanced white light portions of back-directed and passed forth radiation, including blue and yellow light radiation, are 53% and 47%, respectively, while for the yellow light only such portions are 55% and 45%, respectively.

Therefore, a significant gain in light flux and maximum possible efficiency of LED conversion white light sources can be achieved in all conditions being equal, by directing the radiation coming from the photoluminescent phosphor surface immediately irradiated by LED radiation to the exit aperture of the LED light source to a remote converter.

Similar technical solution is proposed in patent U.S. Pat. No. 7,293,908 B2 in which one of the claimed embodiments of the lighting system with side light radiation coupling, which is completed according to this patent, includes a conversion layer which is remote from the LED and located on the light reflector.

This apparatus is most similar to the apparatus according to the present invention and, therefore, and herein further is referred to as a 'prototype'.

The operating principle of the white light source with side light radiation coupling implemented in accordance with patent U.S. Pat. No. 7,293,908 B2 is explained in FIG. 6, which shows a cross-section of one of the claimed embodiments of the lighting system with side light radiation coupling.

Figure 6:
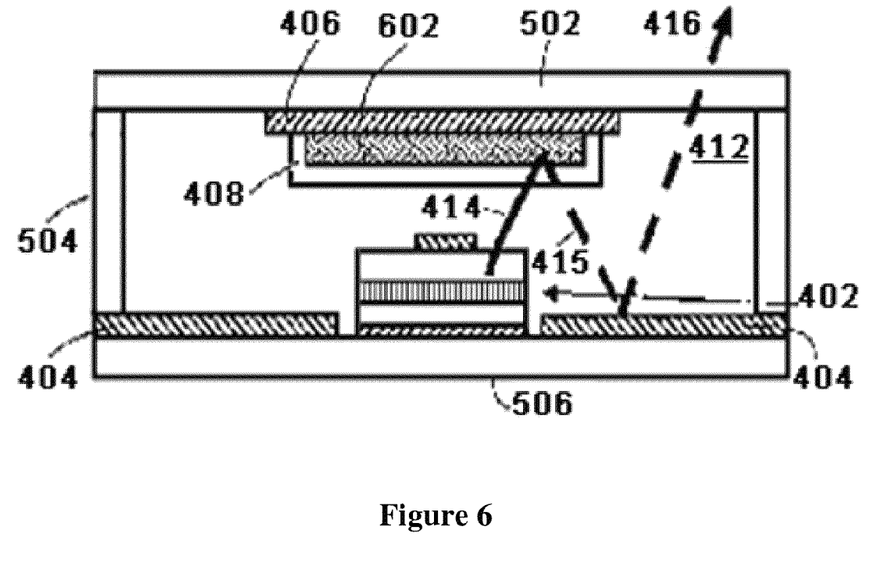
FIG. 6 shows LED white light source with side light radiation of the remote phosphor wavelength converter, as described in prior art.

The lighting system with side light radiation coupling comprises a LED 402, the first reflector 404, the second reflector 406, an exit aperture 412, a conversion layer 602, an additional transparent covering layer 408, and supporting means which support and separate the second reflector 406 from the first reflector 404.

The supporting means include a flat transparent element 502, side supports 504 and a base 506. The side supports 504 are, preferably, transparent or reflective. The first reflector 404 is attached to the base 506. The second reflector 406 is attached to the flat transparent element 502. The conversion layer 602 is located on the second reflector 406 surface and converts at least a portion of the primary radiation emitted by the active area of the LED 402 into radiation with the wavelength different from the primary radiation wavelength.

For the illustrative purposes let us consider light beams 414, 415 and 416, which explain the operation of the lighting system with side light radiation coupling. The light beam 414 of the first color is emitted by the LED 402 active area and directed to the LED 402 output surface. The light beam 414 of the first color passes through the LED 402 output surface and is directed to a transparent covering layer 408. The light beam 414 of the first color passes through the transparent covering layer 408 and is directed to the conversion layer 602, which converts the light beam 414 of the first color in the light beam 415 of the second color different from the first color.

Light of the second color can be emitted in any direction from the point of wavelength conversion. The beam 415 of the second color is directed through the transparent covering layer 408 and, then, directed through the exit aperture 412 to the first reflector 404. The light beam 416 of the second color is reflected by the first reflector 404 and directed to the flat transparent element 502. The light beam 416 of the second color passes through the flat transparent element 502 and comes out the lighting system with side light radiation coupling.

The disadvantage of this system is large aperture losses and loss of light at the boundaries of the supporting means and on the reflectors.

An attempt to overcome these disadvantages was made in another known white light source of searchlight type described in U.S. Pat. No. 7,810,956 B2.

Figure 7:
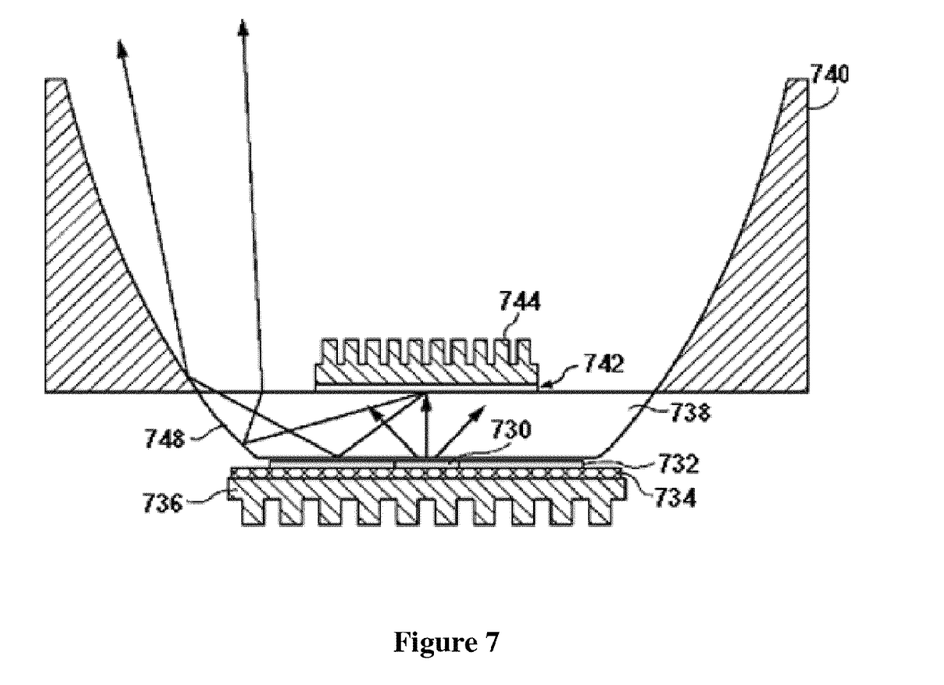
FIG. 7 shows LED white light source with a remote phosphor wavelength converter of searchlight type, as described in prior art.

FIG. 7 illustrating the arrangement and the operating principle of such apparatus, is a cross-section view of a searchlight lamp according to one of the embodiments of the invention claimed in the U.S. Pat. No. 7,810,956 B2. The light source 730 is placed on a fastener 734 and an additional thermal heat sink 736. The thermal heat sink 736 can be finned, as shown in FIG. 7. The light emitted by the source 730 and reflected from the mirror 732 surrounding the light source 730 is radiated in an optical plate 738. The wavelength conversion layer 742 is separated from the light source 730 and placed so the light from the source 730 can be received. The additional thermal heat sink 744 can cool the conversion layer 742. The collecting optics 740 collimates the light. As the light source 730, a LED which generates shortwave light, e.g. blue or ultraviolet light, can be used. The light source 730 can be placed on the additional fastener 734 and attached to the additional thermal heat sink 736. The optical plate 738 can be formed so that it directs light to the collecting optics 740. For example, the sides 748 can be inclined or bent so that the total internal reflection directs light to the collecting optics 740.

The disadvantage of this system is large aperture losses and loss of light at the boundaries of the optical plate with the light source, mirrors, and the conversion layer, which eliminate its efficiency. Furthermore, the light beam outgoing from the collimating optical system is rather thin, which is not acceptable when using this illuminator as a replacement for standard lamps with small form factor, which have sufficient angular aperture of emitted light beam, even if the halogen lamps are used.

The proposed invention is based on the objective to provide maximum efficiency of LED white light source with a remote converter, to provide high color uniformity and rendering, as well as wide angular aperture of the light beam when form factor of the illuminator is small.

An illuminator proposed in the present invention comprises a primary radiation source with one or more LEDs, a heat-removing base with flat peripheral part which the said LEDs are attached to, a reflector with light-reflective surface facing the LEDs, a conversion layer converting the primary radiation into the secondary radiation, which is placed between the LEDs and the reflector.

The set problem is solved so that the heat-removing base for light radiation coupling has an aperture which edge is in close proximity of the LEDs being placed on the heat-removing base, and the specified surface of the conversion layer, which is irradiated by the LEDs, and the reflector surface have a concave shape with the concave side facing the primary radiation source and the aperture.

Figure 8:
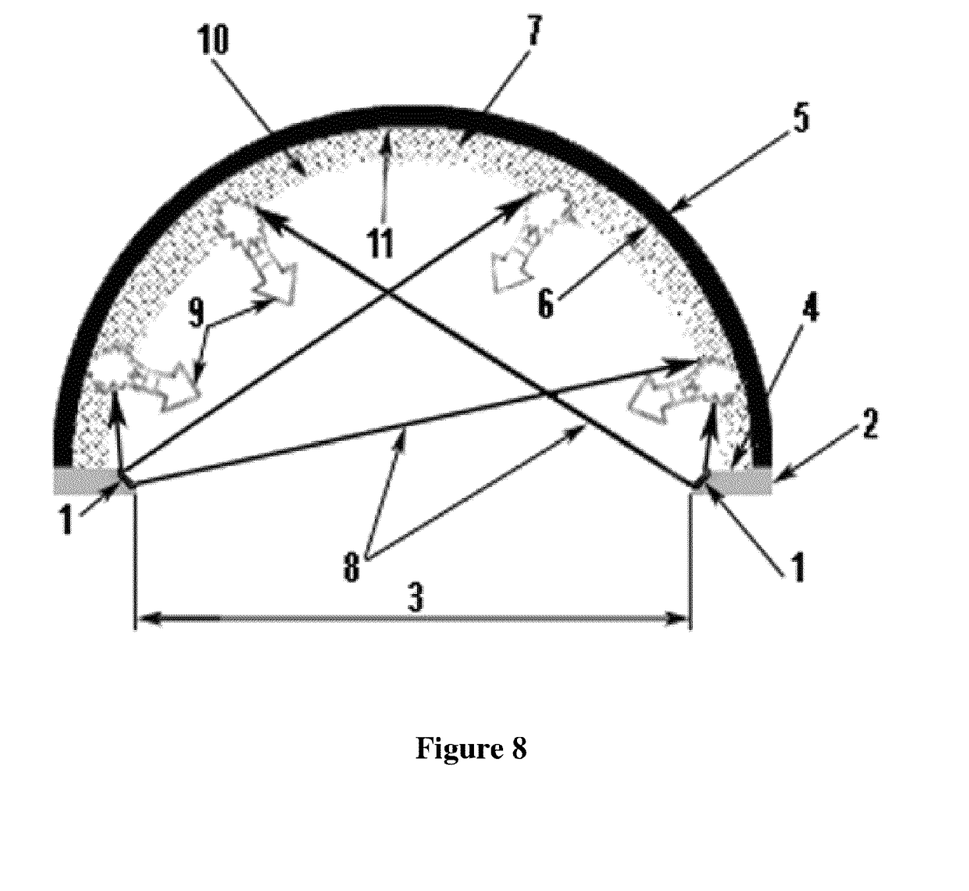
FIG. 8 shows a cross-section of the proposed illuminator, according to a preferred embodiment of the present invention.

The substance of the present invention is explained in FIG. 8 which schematically shows a cross-section of the proposed illuminator.

The illuminator comprises a primary radiation source with one or more LEDs 1, a heat-removing base 2 with an aperture 3 and a surface 4 which the said LEDs 1 are attached to, a reflector 5 with a light-reflective surface 6 facing the LEDs, a conversion layer 7 converting primary radiation 8 into secondary radiation 9, which has a concave surface 10 facing the LEDs 1, and a second convex surface 11 facing the light-reflective surface 6 wherein the conversion layer 7 is placed between the LEDs 2 and the reflector 6 surface.

The illuminator functions as follows: The primary radiation 8 of the LED 1 reaches the surface 10 of the conversion layer 7, then reflects partially from the surface 10, exiting through the aperture 3 of the heat-removing base 2, reflects partially from the surfaces of photoluminescent phosphor grains, being dissipated in the conversion layer 7, is absorbed partially by the conversion layer 7 material transforming into secondary radiation 9; concurrently, a portion of the primary radiation 8 which has reached the light-reflective surface 6, reflects back into the conversion layer 7 and is again partially absorbed by the material of the conversion layer 7 with the conversion into secondary radiation 9 by the photoluminescent phosphor of the conversion layer 7.

In this case, a certain portion of the primary radiation 8 exits the conversion layer through the aperture 3 of the illuminator and mixes with the secondary radiation 9 to form white radiation, the spectral distribution of which is determined by the properties of the conversion layer materials, primarily, by their composition, the photoluminescent phosphor dispersion and the thickness of the conversion layer.

Photoluminescent phosphors are usually optical inorganic materials doped with ions of rare earth elements (lanthanides), or, alternatively, ions of the elements, such as chromium, titanium, vanadium, cobalt or neodymium. Lanthanide elements are lanthanum, cerium, praseodymium, neodymium, promethium, samarium, europium, gadolinium, terbium, dysprosium, holmium, erbium, thulium, ytterbium and lutetium. Optical inorganic materials include (but are not limited to): sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, compounds of yttrium, a lanthanide-aluminum-gallium oxides, yttrium oxide ($Y_2O_3$), calcium or strontium or barium halophosphates $(Ca,Sr,Ba)_5(PO_4)_3(Cl,F)$, the composition $CeMgAl_{11}O_{19}$, lanthanum phosphate ($LaPO_4$), lanthanide pentaborate materials ((lanthanide)(Mg, Zn)$B_5O_{10}$), the composition $BaMgAl_{10}O_{17}$, the composition $SrGa_2S_4$, compounds $(Sr,Mg,Ca,Ba)(Ga,Al,In)_2S_4$, the composition SrS, the composition ZnS and nitride silicates.

There are several typical photoluminescent phosphors which can be excited by UV radiation with a wavelength of 250 nm or close to this. A typical red-emitting photoluminescent phosphor is $Y_2O_3:Eu^{+3}$. A typical yellow-emitting photoluminescent phosphor is YAG:$Ce^{+3}$. Typical green-emitting photoluminescent phosphors include: $CeMgAl_{11}O_{19}$:Tb<3+>, (lanthanide) $PO_4:Ce^{+3},Tb^{+3}$ and $GdMgB_5O_{10}$:$Ce^{+3}$, $Tb^{+3}$. Typical blue-emitting photoluminescent phosphors are $BaMgAl_{10}O_{17}:Eu^{+2}$ and $(Sr,Ba,Ca)_5(PO_4)_3Cl$:$Eu^{+2}$. For a LED of excitation with a longer wave with the wavelength range of 400-450 nm or close to it, the typical optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitride silicates. Typical photoluminescent phosphors for LED of excitation in the wavelength range of 400-450 nm include YAG:$Ce^{+3}$, YAG:$Ho^{+3}$, YAG:$Pr^{+3}$, $SrGa_2S_4$:$EU^{+2}$, $SrGa_2S_4$:$Ce^{+3}$, SrS:$Eu^{+2}$ and nitride silicates doped with $Eu^{+2}$.

Quantum-dot materials are inorganic semiconductor fine particles of less than about 30 nm. Typical quantum-dot materials include (but are not limited to) particles of CdS, CdSe, ZnSe, InAs, GaAs and GaN. Quantum-dot materials can absorb light of one wavelength and then re-emit the light with different wavelengths, which depend on the particle size, particle surface properties, and the inorganic semiconductor material.

The conversion layer can include both one type of photoluminescent phosphor material or quantum-dot material and a mixture of photoluminescent phosphor materials and quantum-dot materials. Using a mixture of more than one of such material is appropriate if it is desirable to have a wide spectral range of the emitted white light (high color rendering). One of the typical approaches to obtain warm white light with high color rendering index is mixing radiation of InGaN LED with the radiation of the mixture of yellow and red conversion photoluminescent phosphors. The conversion layer can include several photoluminescent phosphors that absorb the light emitted by the LED and emit light with a longer wavelength.

For example, for blue LEDs, the conversion layer can include a single photoluminescent phosphor emitting yellow light, or several photoluminescent phosphors that emit red and green light. For ultraviolet LEDs, the conversion layer can include photoluminescent phosphors emitting blue and yellow light, or photoluminescent phosphors emitting blue, green, and red light. Photoluminescent phosphors can be added that emit additional colors, in order to control the color coordinates and the rendering of the mixed light outgoing from the illuminator.

Transparent host materials can include polymer and inorganic materials. Polymer materials include (but are not limited to): acrylates, polycarbonate, fluoroacrylates, perfluoroacrylates, fluorophosphinate polymers, fluorosilicones, fluoropolyimides, polytetrafluoroethylene, fluorosilicones, sol-gels, epoxy resins, thermoplastics, heat-shrink plastics and silicones. Fluorine-containing polymers are especially useful in the ultraviolet ranges of wavelengths shorter than 400 nm and infrared wavelengths longer than 700 nm, due to their low absorption of light at these wavelength ranges. Typical inorganic materials include (but are not limited to): silicon dioxide, optical glasses, and chalcogenide glasses.

The photoluminescent phosphor of the conversion layer can conformally be applied as coating to the surface of the light reflector, e.g., by pulverizing, pasting, deposition or electrical endosmosis from the photoluminescent phosphor suspension in the liquid. One of the problems related to coating the reflector with photoluminescent phosphor is applying a uniform reproducible coating on the reflector, especially if the reflector has a non-planar surface, for example, cylindrical or hemispherical. Liquid suspensions are used to apply photoluminescent phosphor particles to the substrate when the pulverizing, pasting, deposition methods are applied. The uniformity of coating greatly depends on the viscosity of the suspension, particle concentration in suspension, and environmental factors, such as ambient temperature and humidity. Coating defects due to flows in the suspension before drying, and daily changes of the coating thickness are classified as ordinary problems.

In some cases, it is preferable to add the photoluminescent phosphor into the coating material, for example, transparent plastic, such as polycarbonate, PET, polypropylene, polyethylene, acrylic, shaped by extrusion. In this case, the conversion layer can be pre-manufactured in sheets, which are then heat molded into the desired shape. Before molding, the light-reflective coating made of, for example, aluminum or silver can be applied to one surface of the sheet by vacuum deposition.

The conversion layer of the conformally preformed reflective surface of a heat radiator can be attached to it, for example, with a silicone adhesive located between the conversion layer and the reflective surface of the heat radiator. In this case, the adhesive layer can be thin, thinner, for example, than the conversion layer, and cannot maintain a large thermal resistance to the heart removal from the conversion layer.

In one of specific embodiments of the inventive illuminator, a preformed sheet is used, which is pasted to a copper or brass cylindrical reflector with a thin layer of aluminum (0.5 µm), which is applied by vacuum thermal evaporation. An organic solvent is used to prepare the suspension of photoluminescent phosphor, surface-active agents (surfactants) and the polymer. The suspension can then be formed into a sheet by extrusion or mold casting or it can be poured on a flat substrate, for example, a glass one, followed by drying. The resulting sheet can be separated from the temporary substrate and attached to the reflector, using a solvent or cyanoacrylate adhesive. The reflector coated with the sheet is heated at 480° C., and the polymer matrix burns down, leaving the photoluminescent phosphor coating.

In a specific example, sheets of different thicknesses, were formed by extrusion from the suspension of particles of an experimental photoluminescent phosphor based on yttrium-gadolinium-cerium aluminium garnet $(Y,Gd,Ce)_3Al_5O_{12}$ in a polycarbonate solution in methylene chloride. The conversion layer must be sufficiently thick to achieve the necessary color coordinate values of mixed white light outgoing from the illuminator aperture. The effective thickness is defined based on optical scattering processes in photoluminescent phosphors used and ranges, for example, between 5 and 500 µm, most often between 100 and 250 µm.

The sheet was secured to a cylindrical reflector by way of moistening the reflector with isopropanol and applying pressure to the sheet using a male die of a desired shape. The solvent softens the sheet and allows squeezing out air bubbles from under it to ensure full adhesion of the sheet to the reflector. The coated reflector was annealed in air at 480° C. to burn off the polymer, resulting in the cylindrical reflector covered with the photoluminescent phosphor. The reflector of a less complicated shape can be coated with a mixture of photoluminescent phosphor with transparent silicone binder; then, the mixture is annealed.

In this case, the silicone binder is not removed by annealing. It must be borne in mind that photoluminescent phosphor, which converts blue light in the orange-red one, can degrade until complete uselessness after is has been heated to 480° C. in air. In this case, other polymers with a lower burning-off temperature must be used. In some embodiments, the burning-off temperature ranges from 260° C. to 540° C.

The surface of the conversion layer can be additionally coated with a transparent protective layer, which prevents the ingress of moisture and/or oxygen into the conversion layer, as some types of photoluminescent phosphors, e.g., sulfide one, are prone to damage from moisture attacks. The protective layer can be made of any transparent material which prevents moisture and/or oxygen from penetrating into the conversion layer, for example, made of inorganic materials, such as silicon dioxide, silicon nitride or aluminum oxide, and organic polymers or combinations of polymeric and inorganic layers. The preferable materials for the protective layer are silicon dioxide and silicon nitride.

The protective layer can also optically clear the boundary of a photoluminescent phosphor grain with the atmosphere and can reduce the reflection of the LED primary radiation and the secondary radiation of the photoluminescent phosphor on this boundary, reducing the absorption losses of the photoluminescent phosphor self-radiation in its grains, thereby increasing the efficiency of the illuminator.

The protective layer can also be applied by finishing surface treatment of photoluminescent phosphor grains, which, among other things, causes to form a nano-sized 50-100 nm film of zinc silicate on the surface of the grains, that clears the boundary of the photoluminescent phosphor grain.

Where necessary, the aperture can be additionally hermetically sealed with an optically transparent window that protects the conversion layer from moisture and/or oxygen, while the internal volume of the illuminator can be filled with an inert atmosphere, or evacuated.

The surface 10 of the converter 7 and the surface 6 of the reflector 5 can be shaped as axisymmetric figures (a sphere, ellipsoid, paraboloid, or otherwise) or surface symmetric figures (e.g., cylinder), truncated by a plane, which is, for example, parallel to the plane of the aperture 3 in the heat-removing base 2; in this case, the LEDs 1 are located near and along the conventional line of intersection of the said surface of the heat-removing base 2 with the said surface 10 of the converter 7.

The optimization of the converter surface 10 shape and of the location of the LED based on their radiation directivity diagram allows improving the color uniformity and angular distribution of the radiation coming out of the illuminator due to the incidence of the LED radiation to the converter surface 10 at different angles and redistribution of the reflected radiation inside the cavity of the converter 7 before its exit from the aperture.

As known from the specifications, say, for SemiLEDs chips of strong blue LED SL-V-B45AC2 or EZBright1000 family chips manufactured by CREE, the radiation directivity diagram of LED chips can have the Lambertian distribution (a light cone with an angle of obliquity of 90° to the surface of the LED chip) or be limited to a less cone with the angle $\alpha<90°$, for example, when radiation is coupled out using a quantum-sized lattice structure formed on the surface of the LED chip.

In this case, the LED can be located on the heat-removing base in such a way that the axis of the LED radiation directivity diagram intersects the axis of symmetry of the reflector at an angle $\beta \geq 90°-\alpha/2$.

Figure 9:
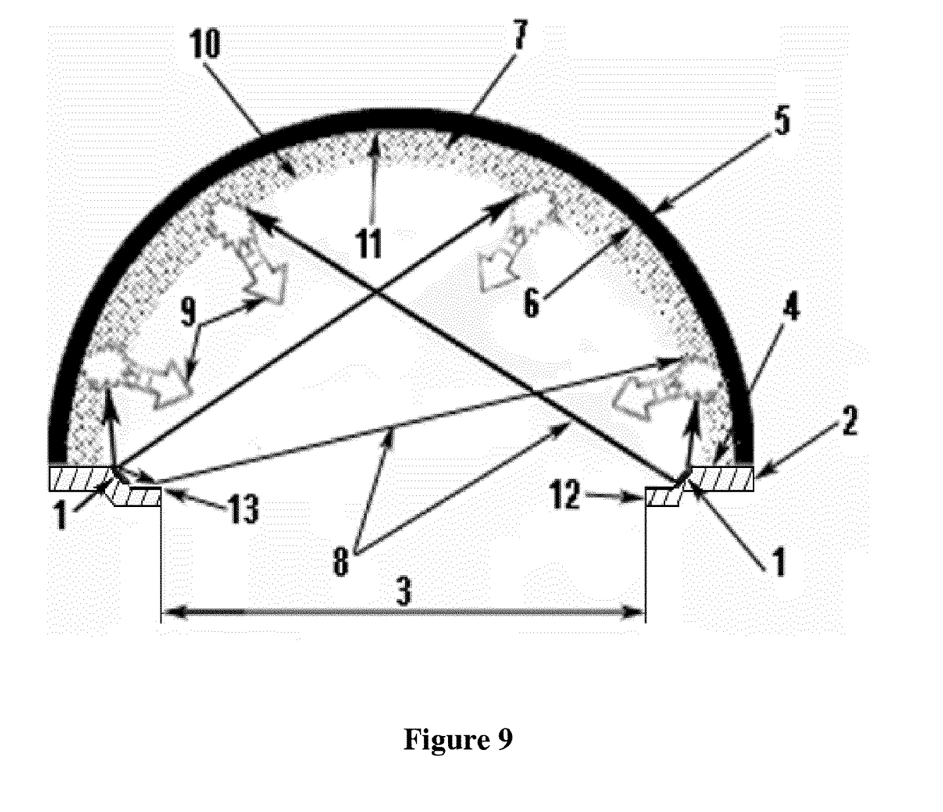
FIG. 9 shows an embodiment of the proposed illuminator comprising an additional reflector.

However, a certain relatively small part of the LED primary radiation propagates directly outwardly the illuminator aperture; and to avoid the possible user's direct eye contact with the LED light, the heat-conducting base 2 can comprise a protrusion 12 that screens the direct yield of the primary radiation outwards the illuminator, bypassing the surface 10 of the converter 7. To ensure a more complete utilization of the LED primary radiation, the said protrusion 12 of the heat-conducting base 2 comprises an additional reflector—a flat mirror part 13 that directs the primary radiation falling on it towards the surface 10 of the converter 7.

The embodiment of the inventive illuminator comprising an additional reflector is schematically shown in FIG. 9 in more details.

The illuminator in this embodiment includes a protruding part 12 with a reflective coating 13 in addition to the elements shown in FIG. 8 and numbered in the same way as in FIG. 8.

Figure 10:
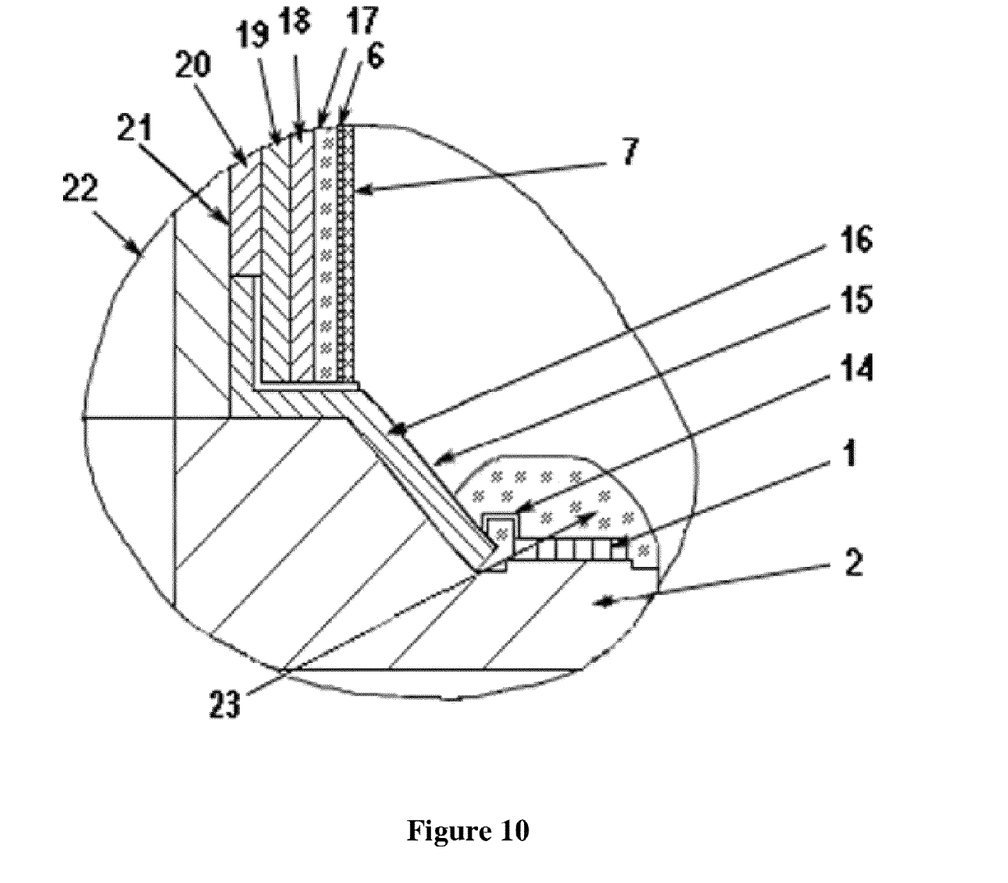
FIG. 10 shows another embodiment of the proposed illuminator comprising an additional reflector.

Another specific embodiment of the inventive illuminator with an additional reflector is shown in details in FIG. 10, which shows an enlarged sectional view of the illuminator in the area of the base 2 with fixed LEDs 1 where the corresponding components are numbered in the same way as in FIG. 8 (not to scale).

The additional reflector is an inclined surface 15 (for example, a truncated conical surface put the base upwards in the case of an axisymmetrically shaped converter) located between the LED chips 1 and the converter 7, the reflection from which allows almost completely redirecting the portion of the LED chips 1 radiation falling onto it to the opposite side of the converter 7, which homogenizes the outgoing radiation of the illuminator.

To increase the reflection of light emitted by the LEDs and the conversion layer, the surface of the reflector in the heat radiator can be, among other things, polished or matted to homogenize the radiation and it can be covered with a coating with a high optical reflectance. The surface of the light reflector can also be made as a separate mirror distanced from the heat radiator, but maintaining a thermal contact with it through a thermally conductive layer. Examples of suitable coatings and materials for highly reflective coatings include silver; aluminum; dichroic coatings; aluminum combined with a dichroic coating to enhance the reflection coefficient of aluminum; and materials, such as titanium oxide and aluminum oxide, formed by the sol-gel method.

In this embodiment of the inventive illuminator, the LED chips 1 are located on the base 2 so that the normal to the surface of the LED chip 1 is parallel (or makes a small angle) to the axis of symmetry of the reflector 6 made as a 0.15-0.2 μm thick reflecting aluminum or silver film applied by vacuum thermal deposition to the inner surface of a hemispherical glass cap 17, glued with an elastic heat-resistant compound 18 to the aluminum hemispherical cap 19, which acts as the second common electrode for the LED chips 1 that are connected to it in parallel by means of the conductors 14 and the polyimide ribbon 16 with the metallic coating 15. To enhance the light reflectivity, the metallic coating 15 on the polyimide ribbon is coated with a thin aluminum layer and serves as an additional reflector in addition to being the electric contact. With this layout of the LEDs, their primary radiation does not directly enter the eye of an observer.

The first electrode is the base 2, to which the LED chips 1 are soldered, and the heat radiator 22 that is in electrical and thermal contact with the base 2. Electrical power is supplied to the cap 19 by the central cylindrical output (not shown on FIG. 10) that is welded (or soldered) to the top of the cap 19 in axial alignment with the axis of symmetry of the reflector 6 and connected through an electrically insulated hole in the inner surface 21 of the heat radiator 22 to the supply driver located in the corresponding cavity made in the upper part of the heat radiator body (not shown).

The hemispherical cap 19 is bonded with the heat-resistant heat-conducting compound 20 to the inner surface 21 of the heat radiator 22 body.

The hemispherical cap 17 can also be made of heat-conducting ceramic. The hemispherical cap 19 can also be made of stainless steel, copper, brass, Kovar, or any similar material.

If the cap 19 is made of Kovar or another similar alloy that has relatively good thermal conductivity and a relatively low coefficient of thermal expansion, which is closest to the thermal expansion coefficient of the photoluminescent phosphors used in the converter 7, the design of the illuminator can be simplified and made cheaper and it can be made without the cap 17. To this end, the reflecting aluminum or silver film is applied by vacuum thermal deposition (or otherwise) to the inner surface of the Kovar cap 19, either directly or via an intermediate thin-film dielectric coating, followed by deposition of a photoluminescent phosphor layer using one of the previously described methods.

If the cap 19 is made of aluminum, stainless steel, copper, brass or similar materials with a relatively high coefficient of thermal expansion that is closest to the coefficient of thermal expansion of the converter 7 made of plastics with photoluminescent phosphor filler, the illuminator also can be made without cap 17. To this end, the inner surface of the cap 19 is polished and/or the reflecting aluminum or silver film is applied by vacuum thermal deposition, either directly or via an intermediate thin-film dielectric coating, followed by bonding a preformed plastic converter 7.

LED chips 1 and wire contacts 14 can be sealed with the optical compound 23 using the known technology applied in the manufacture of LED assemblies.

Figure 11:
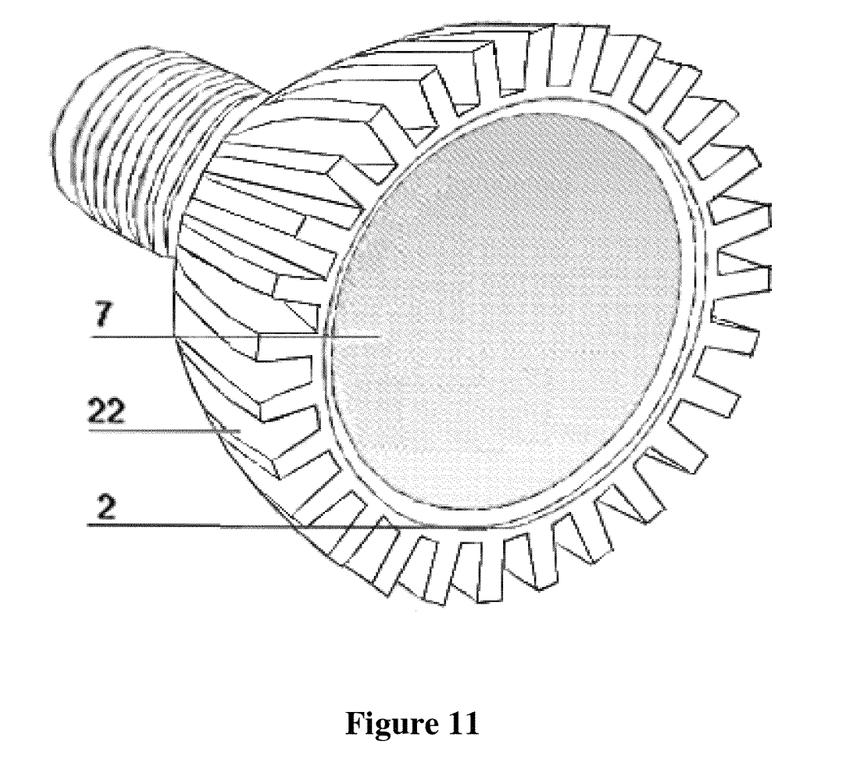
FIG. 11 shows an embodiment of the proposed illuminator comprising a ribbed heat radiator.

The heat radiator 22 can be made of any suitable material, such as copper or aluminum. The heat radiator can be ribbed to increase the heat transfer surface, for example, as shown in FIG. 11.

The mentioned before polycarbonate sheets with $(Y,Gd,Ce)_3Al_5O_{12}$, using SL-V-B35AK-type LED chips manufactured by SemiLEDs, were used to manufacture samples of white linear semicylindrical illuminators, that achieved the effectiveness of 160-200 lm/W, depending on the sheet thickness.

REFERENCES

1. Yamada, K., Imai, Y. and Ishii K., "Optical Simulation of Light Source Devices Composed of Blue LEDs and YAG Phosphor," *J. Light & Vis. Env.* 27(2), 70-74 (2003).
2. Narendran, N., Gu. Y., Freyssinier, J., Zhu, Y., "Extracting Phosphor-scattered Photons to Improve White LED Efficiency," *Phys. Stat. Sol.* (a) 202(6), R60-R62 (2005).
3. Zhu Y., N. Narendran, and Y. Gu. "Investigation of the optical properties of YAG:Ce phosphor". *Sixth International Conference on Solid State Lighting. Proceedings of SPIE.* 6337, 63370S (2006).

The invention claimed is:

1. An illuminator comprising:
   a heat-removing base having a base surface, an aperture on the base surface dividing the base surface on a first end, a second end, a periphery, and angled edges formed near the periphery of the aperture;
   a primary radiation source including at least one light-emitting diode, the at least one light-emitting diode is located on the angled edge formed near the periphery of the aperture in the heat removing base;
   a reflector having a light reflective surface facing the at least one light-emitting diode, the light reflective surface having a concave shape;
   a radiation conversion layer located between the at least one light-emitting diode and the reflector, the radiation conversion layer having a concave surface facing the at least one light-emitting diode and a convex surface facing the reflector, the radiation conversion layer including photoluminescent phosphorous grains, the radiation conversion layer converts a first radiation emitted by the at least one light-emitting diode and into a second radiation;
   wherein:
   a first portion of the first radiation emitted by the at least one light-emitting diode reflects from the concave surface of the radiation conversion layer existing through the aperture of the heat-removing base;
   a second portion of the first radiation emitted by the at least one light-emitting diode is transformed into the second radiation by the photoluminescent phosphorous grains on the radiation conversion layer;
   a third portion of the first radiation emitted by the at least one light-emitting diode reaches the concave surface of the light reflective surface of the reflector, reflects back to the conversion layer, is partially absorbed by the photoluminescent phosphorous grains on the radiation conversion and exists through the aperture of the heat-removing base and mixing with the second radiation forming a white radiation.

2. The illuminator according to claim 1, wherein said aperture is positioned in a plane, the surface of the conversion layer and the light reflective surface of the reflector have axisymmetric shapes, the axisymmetric shapes are cut by a plane parallel to the plane of the aperture.

3. The illuminator according to claim 2, wherein the axisymmetric shapes are selected from the group consisting of an ellipsoid of revolution of a sphere or a paraboloid, and wherein the axisymmetric shapes include main axes extending perpendicular to the plane of the aperture.

4. The illuminator according to claim 1, wherein said aperture is positioned in a plane, the surface of the conversion layer and the light reflective surface of the reflector have symmetric shapes, the symmetric shapes are cut by a plane parallel to the plane of the aperture.

5. The illuminator according to claim 4, wherein the symmetric shape is a truncated cylinder with an axis of symmetry extending perpendicular to the plane of said orifice.

6. The illuminator according to claim 1, wherein the reflector is a heat-removing radiator having a ribbed outer surface and an inner surface; and wherein the inner surface is the light reflective surface.

7. An illuminator comprising:
a heat-removing base having a base surface, an aperture on the base surface dividing the base surface on a first end, a second end, a periphery, angled edges formed near the periphery of the aperture, and a protrusion connected to a free end of the angled edge, the protrusion is horizontally aligned and includes a reflective flat top surface;
a primary radiation source including at least one light-emitting diode, the at least one light-emitting diode is located on the angled edge formed near the periphery of the aperture in the heat removing base;
a reflector having a light reflective surface facing the at least one light-emitting diode, the light reflective surface having a concave shape;
a radiation conversion layer located between the at least one light-emitting diode and the reflector, the radiation conversion layer having a concave surface facing the at least one light-emitting diode and a convex surface facing the reflector, the radiation conversion layer including photoluminescent phosphorous grains, the radiation conversion layer converts a first radiation emitted by the at least one light-emitting diode and into a second radiation;
wherein:
a first portion of the first radiation emitted by the at least one light-emitting diode reflects from the concave surface of the radiation conversion layer existing through the aperture of the heat-removing base;
a second portion of the first radiation emitted by the at least one light-emitting diode is transformed into the second radiation by the photoluminescent phosphorous grains on the radiation conversion layer;
a third portion of the first radiation emitted by the at least one light-emitting diode reaches the concave surface of the light reflective surface of the reflector, reflects back to the conversion layer, is partially absorbed by the photoluminescent phosphorous grains on the radiation conversion and exists through the aperture of the heat-removing base and mixing with the second radiation forming a white radiation.

8. The illuminator according to claim 7, wherein the reflective flat top surface is a mirror.

9. The illuminator according to claim 1, wherein the heat-removing base is made integral with the reflector.

10. An illuminator comprising:
a heat-removing base having a base surface, an aperture on the base surface dividing the base surface on a first end, a second end, a periphery, and angled edges formed near the periphery of the aperture, the angled edge having an angle $\beta$, wherein $\beta$ is calculated by:

$\beta \geq 90° - \alpha/2$ wherein $\alpha$ is an angular width of the corresponding light-emitting diode;
a primary radiation source including at least one light-emitting diode, the at least one light-emitting diode is located on the angled edge formed near the periphery of the aperture in the heat removing base;
a reflector having a light reflective surface facing the at least one light-emitting diode, the light reflective surface having a concave shape;
a radiation conversion layer located between the at least one light-emitting diode and the reflector, the radiation conversion layer having a concave surface facing the at least one light-emitting diode and a convex surface facing the reflector, the radiation conversion layer including photoluminescent phosphorous grains, the radiation conversion layer converts a first radiation emitted by the at least one light-emitting diode and into a second radiation;
wherein:
a first portion of the first radiation emitted by the at least one light-emitting diode reflects from the concave surface of the radiation conversion layer existing through the aperture of the heat-removing base;
a second portion of the first radiation emitted by the at least one light-emitting diode is transformed into the second radiation by the photoluminescent phosphorous grains on the radiation conversion layer;
a third portion of the first radiation emitted by the at least one light-emitting diode reaches the concave surface of the light reflective surface of the reflector, reflects back to the conversion layer, is partially absorbed by the photoluminescent phosphorous grains on the radiation conversion and exists through the aperture of the heat-removing base and mixing with the second radiation forming a white radiation.

* * * * *